United States Patent [19]
Burns

[11] Patent Number: 5,589,763
[45] Date of Patent: Dec. 31, 1996

[54] COHERENT UNDERSAMPLING DIGITIZER FOR USE WITH AUTOMATIC FIELD TEST EQUIPMENT

[75] Inventor: Mark A. Burns, Garland, Tex.

[73] Assignee: Texas Instruments Incorporated, Dallas, Tex.

[21] Appl. No.: 442,538

[22] Filed: May 16, 1995

[51] Int. Cl.[6] .................................................. G01R 13/34
[52] U.S. Cl. .................................. 324/76.15; 324/76.42; 324/76.58
[58] Field of Search ........................... 324/76.15, 76.24, 324/76.38, 76.42, 76.58; 327/40, 43; 341/165

[56] References Cited

U.S. PATENT DOCUMENTS

| | | | |
|---|---|---|---|
| 4,083,043 | 4/1978 | Breuer | 341/165 |
| 4,641,246 | 2/1987 | Halbert et al. | 324/76.15 X |
| 4,799,165 | 1/1989 | Hollister et al. | 324/76.15 X |
| 4,807,147 | 2/1989 | Halbert et al. | 324/76.15 X |
| 4,862,073 | 8/1989 | Barrow | 324/76.15 X |

*Primary Examiner*—Kenneth A. Wieder
*Assistant Examiner*—Diep Do
*Attorney, Agent, or Firm*—W. Daniel Swayze, Jr.; W. James Brady, III; Richard L. Donaldson

[57] ABSTRACT

An apparatus measures a repetitive signal in a coherent manner, including a signal generating circuit to output the repetitive signal in accordance with first clock signals which are generated by a first clock circuit. A sampling circuit samples the repetitive signal in accordance with second clock signals to output a sampled signal, the second clock signals are output by a second clock circuit. An output circuit stores the sampled signals and outputs a reconstructed signal based on said sampled signal.

7 Claims, 3 Drawing Sheets

HIGH SPEED DIGITIZER UNDERSAMPLING SAR PROCESS

NON-COHERENT SAMPLE SET

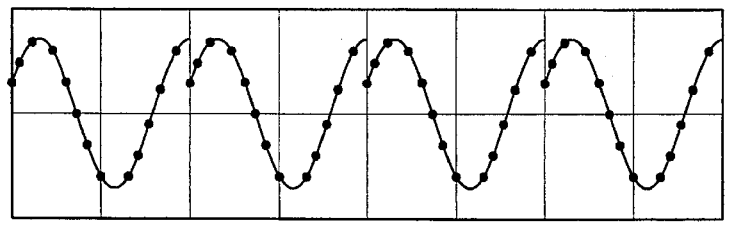
FIG. 4
(PRIOR ART)
FFT INTERPRETATION OF THE NON-COHERENT SAMPLE SET       DISCONTINUITY
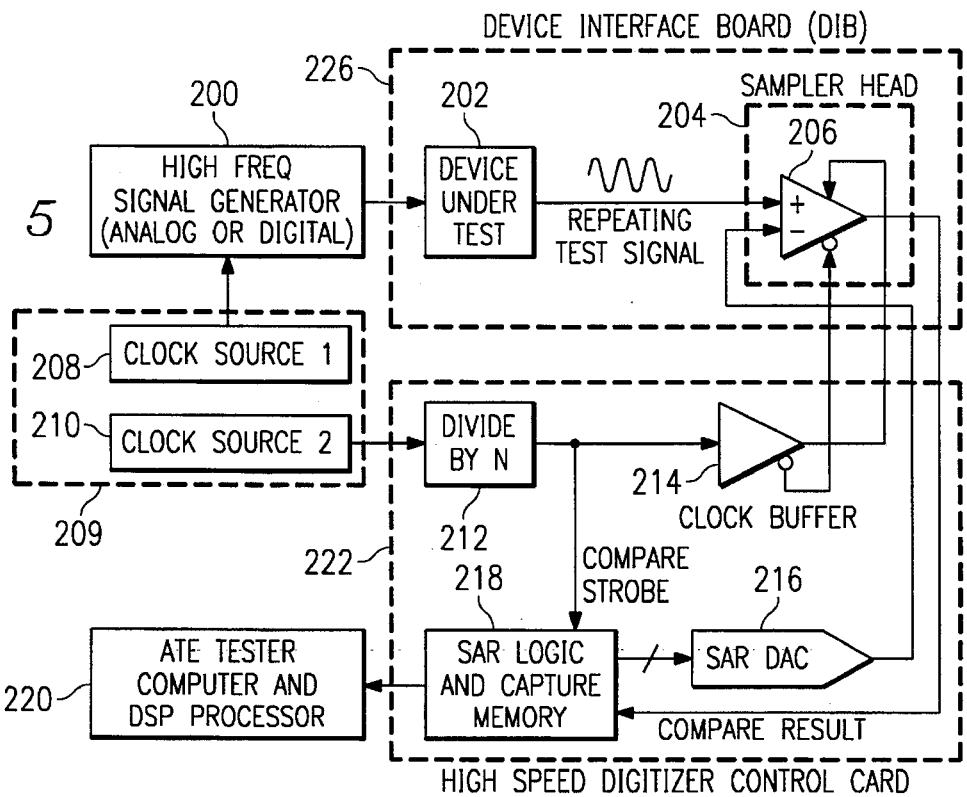
FIG. 5
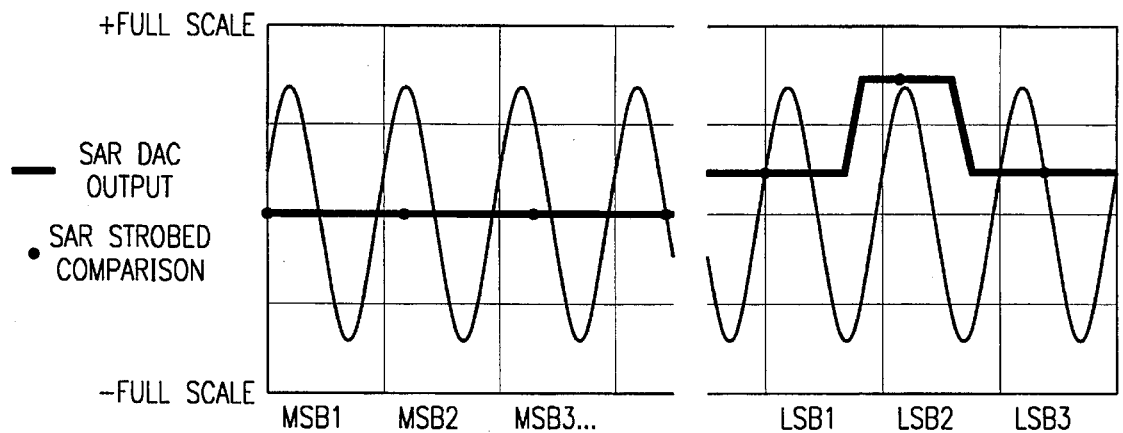
FIG. 6      COHERENT UNDERSAMPLING SAR PROCESS

COHERENT UNDERSAMPLING DIGITIZER FOR USE WITH AUTOMATIC FIELD TEST EQUIPMENT

TECHNICAL FIELD OF THE INVENTION

This invention relates to electronic test and measurement equipment and, more particularly, to the field of automated test equipment (ATE).

BACKGROUND OF THE INVENTION

Previous, prior art Automated Test Equipment have attempted to measure high frequency signals, but the measurement of these high frequency signals has proven difficult. The results of the measurements when they have been obtained have often been unsatisfactory. One reason for the difficulty is related to the parasitic effects of the hardware fixturing of the prior art ATE equipment. Stray capacitance and inductance from the fixturing such as wafer probes, handler contactors and device sockets often have a detrimental effect on the high frequency electrical signals to be measured. Exemplary, the settling time of a palette digital to analog converter (DAC) could be difficult to accurately measure through a long wire since the inductance of this long wire would corrupt or affect the signal to be measured.

Matched impedance terminated coaxial cables have been used successfully in prior art ATE test fixtures to reduce the inductive and capacitive effects of the signal transmission path. A properly terminated coaxial cable appears as a purely resistive load to the device under test (DUT). Such terminated cables can only be successfully used to measure a signal if the device under test (DUT) is capable of driving the termination resistance without significantly affecting the signal under test. Typical ATE coaxial cables require a termination resistance of either fifty or ninety Ohms and as such require the DUT to drive a fifty or ninety Ohm resistive load. Many devices do not have such low impedance drive capability and as a consequence prior art ATE equipment cannot easily be used to measure high frequency electrical signals.

Measurements of these high frequency signals are also affected adversely by the limited speed of the A/D converters of the prior art. These prior art converters are adapted to operate at higher sampling rates which disadvantageously limits their voltage resolution. Exemplary, if a converter operates at a required sampling rate of 20 MHZ, the digitizer of the converter may have a resolution of only 12 bits instead of the preferred 16 to 24 bits common to lower frequency converters.

In certain prior art high speed digitizers, the stray inductance/capacitance and sampling resolution problems have been minimized by positioning a very high speed strobed comparator near the device under test (DUT). This comparator is used as a front-end to an undersampling successive approximation routine (SAR) A/D converter. Positioning the comparator near the DUT tends to minimize the effects of stray capacitance and inductance on the signal to be tested. FIG. 1 illustrates a prior art high speed digitizer including a SAR controller card and sampler head module. The sampler head includes a high bandwidth strobed comparator circuit positioned in an electrostatic metal can. The sampler head is positioned on the device interface board DIB near the device under test. The device under test is required to drive only the small input capacitance of the sampler head comparator plus a small amount of additional stray inductance/capacitance that is introduced by the signal path between the device under test and the sampler head. This provides a measurement circuit and signal path having a very high bandwidth. Additionally this measurement circuitry does not load the device under test with excess parasitic inductance and capacitance.

FIG. 2 illustrates a three-bit undersampled analog to digital A/D conversion of a sine wave which has been input to the sampler head. The broken line indicates the output of the SAR DAC which has been placed initially at its mid-scale voltage. At time=0, the one-bit result of a strobed comparison between the SAR DAC output voltage and the input sine wave is stored within the SAR logic and capture memory of FIG. 1. This bit corresponds to the most significant bit (MSB) of the first digitized sample. At a predetermined time after the capture of the first MSB, the output of the SAR DAC is raised to ½ full scale or lowered to −½ full scale, depending on the value of the previously determined MSB. At the first increment of time, the process is repeated to obtain another strobed comparison between the output of the SAR DAC and the input sine wave. Again, this second comparison result is stored in the SAR logic and capture memory of FIG. 1, along with the previously captured MSB. After the first increment of time, the output of the SAR DAC is again adjusted to reflect the first and second comparison results, continuing the successive approximation process in a binary search. At the second increment of time, the least significant bit of the first sample is obtained with a third strobed comparison and the SAR DAC output is returned to its mid-scale voltage. This completes the collection of the data for the first sample and the process is subsequently repeated for the second sample and the third sample, respectively. The strobed comparisons for each three-bit sample are taken at the same voltage point on the repeating input waveform. To sample different points on the input waveform, the strobed comparison timing for each three-bit sample must be offset from the strobe timing of the previous sample by a small time slip. The magnitude of time slip controls the high speed digitizer's effective sampling rate. Exemplary, a 100 ps time slip corresponds to a 10 GHz effective sampling rate. Although, FIG. 2 illustrates that the comparisons for each digitized sample are taken once per input waveform repetition period, it should be understood that the comparisons can be separated by any integer multiple of the input waveform repetition period to allow more settling time for the SAR DAC output.

The comparisons obtained from the comparator for the successive approximation routine are timed by employing a fixed frequency sampling clock combined with a swept delay circuit located in the prior art high speed digitizer. Because the SAR DAC operates at a relatively low frequency, a high resolution DAC can be chosen to increase the voltage resolution of the undersampling digitizer to sixteen or more bits.

The undersampling technique provides a high effective sampling rate, high resolution combination that would not be achievable using other prior art A/D converters. However, due to imperfections in the swept delay circuit, timing errors are introduced into the conversion of the analog signal. Three types of timing errors are common in the prior art digitizer: sweep range error, sweep linearity error, and timing jitter. Timing jitter results in increased noise in the digitized signal. Sweep linearity error produces distortion in the digitized signal. Sweep range error causes the time slip between samples to be either too large or too small, producing sampling rate error. Sampling rate error results in a digital signal that is incompatible for use with a non-windowed fast Fourier transform (FFT) mathematical routine. This aspect limits the desirability of using a swept delay circuit. More specifically, non-windowed FFT analysis is used extensively within the field of automatic test equipment to measure gain, distortion, signal to noise ratio, and many other common AC channel parameters. The inability to use non-windowed FFT analysis is a large disadvantage in the prior art.

The timing inaccuracies resulting from the swept delay generator result in a non-coherent sample set such as the one illustrated in FIG. 3. If an FFT is performed on the non-coherent data set, discontinuities such as those illustrated in FIG. 4 result from this transformation. The FFT routine attempts to interpret the non-repeating signal as a repeating one. Because the improperly interpreted signal contains a discontinuity corresponding to the endpoints of the sample set, non-windowed FFT analysis of the non-coherent sample set may result in significant measurement errors.

Thus, an important criterion of a captured digital signal is that it must be coherent to be compatible with non-windowed FFT analysis. The coherence requirement dictates that multiple copies of a digital signal sample set, placed end to end, must transition smoothly from the last sample in one copy to the first sample in the next. When the swept delay circuit is used in conjunction with undersampling techniques in prior art undersampling digitizers, the digital signals output from the digitizers are generally not coherent since timing of the swept signals are not well controlled. Although the waveform resulting from the swept delay undersampling digitizers are useful for time domain analysis such as rise time, fall time, and duty cycle, frequency domain analysis employing a non-windowed FFT is not reliable. Furthermore, timing jitter and sweep non-linearity errors of the swept delay undersampling digitizer increase the error in the sampling times which in turn adds distortion and noise.

SUMMARY OF THE INVENTION

The present invention provides an apparatus including test equipment that performs undersampled analog to digital conversion. The invention eliminates the coherence and linearity problems of the prior art by replacing the swept delay generator with a circuit that employs a precise frequency ratio to generate evenly spaced sample times or intervals to determine when to compare the signal to be tested with the output of the SAR DAC. These sample times accurately wrap from the last sample of the series to the first sample of an identical series in a coherent manner. Consequently, the output of the analog to digital converter circuit is compatible with non-windowed FFT routines.

The present invention may be used in conjunction with testing various mixed signal devices including video palette DAC's and hard disk drive read/write devices. Additionally, the present invention may be used in conjunction with various radio frequency (RF) devices having signal bandwidths approaching 1 GHz. The present invention may include a dock circuit to output dock pulses at two different frequencies with each of the frequencies being controlled so that a predetermined relationship is maintained between the two frequencies. The DUT input signal may repeat at a frequency equal to the frequency of the first dock divided by a positive integer M. The strobed comparisons may occur at a rate of the second dock frequency divided by a second integer N. The second frequency may equal $N/(M(1+D/S))$ times the first frequency where S is the number of digitized samples to be collected and D is any positive or negative integer that is mutually prime with S.

The present invention includes an apparatus for measuring a repetitive signal in a coherent manner, including a signal generating circuit to output the repetitive signal to the DUT in accordance with first clock signals, a first clock circuit coupled to the generating circuit to output the first clock signals, a sampling circuit to sample the repetitive signal in accordance with second clock signals and to output a sampled signal, a second clock circuit coupled to the sampling circuit to output the second clock signals, an output circuit to store the sampled signals and output a successive approximation signal based on the sampled signal. Additionally, the present invention samples all most significant bits of said sampled signal before sampling less significant bits of said sampled signal. This differs from the prior art in that prior art converters perform the SAR process on each sample from MSB to LSB before performing the SAR process for subsequent samples.

DETAILED DESCRIPTION OF THE DRAWINGS

Additional features of the invention will be more readily apparent from the following detailed description and appended claims when taken in conjunction with the drawings in which:

FIG. 4 illustrates a FFT interpretation of the sample set of FIG. 3;

FIG. 5 illustrates an undersampling SAR analog to digital converter with two clock sources;

FIG. 6 illustrates the input to the A/D of FIG. 5 and the output of the SAR DAC.

DETAILED DESCRIPTION OF THE INVENTION

Figure 1:
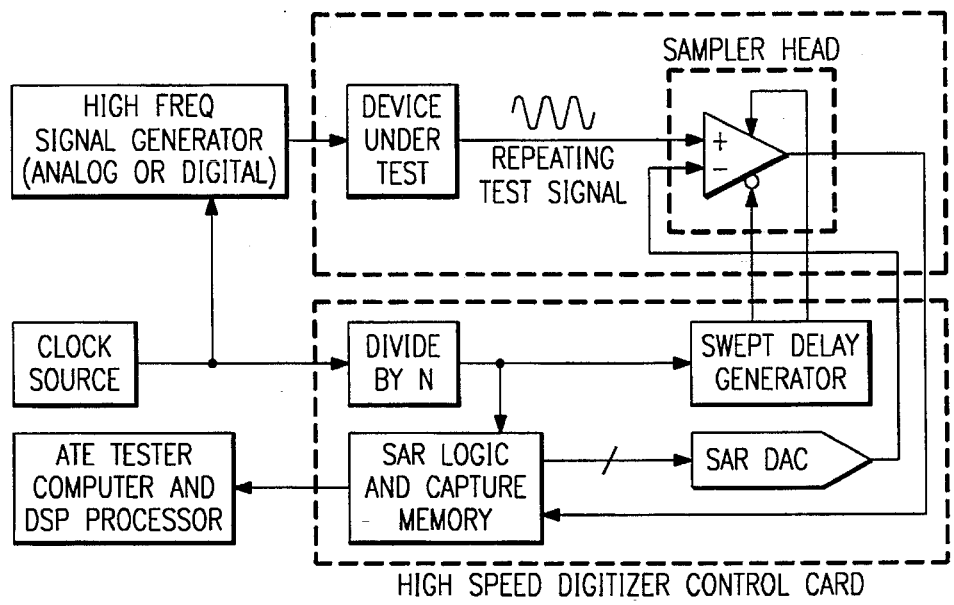
FIG. 1 illustrates a prior art undersampling SAR A/D converter circuit employing a swept delay generator.
Figure 2:
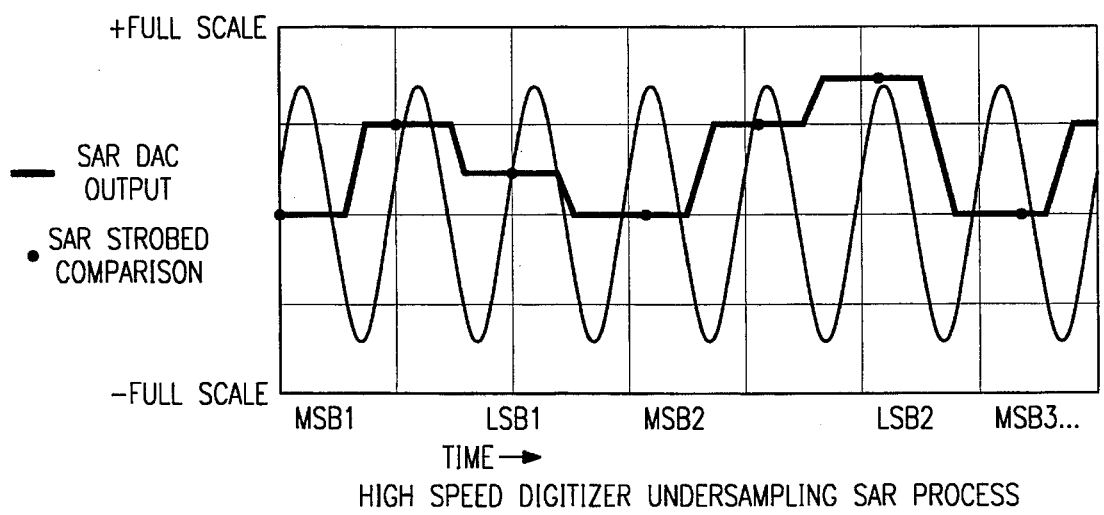
FIG. 2 illustrates the input and SAR DAC output of the prior art SAR A/D circuit.
Figure 3:
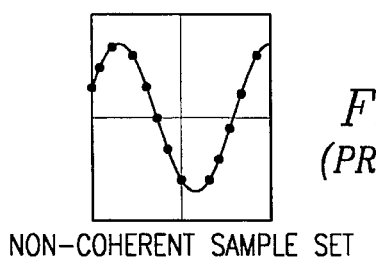
FIG. 3 illustrates a non-coherent sample set from the prior art undersampling A/D.

FIG. 5 illustrates a coherent undersampling SAR A/D converter including two clock sources that output clock pulses at differing frequencies. The first clock circuit 208 outputs clock pulses at a first predetermined frequency while the second clock circuit 210 outputs clock pulses at a second predetermined frequency which is a predetermined amount or rate lower or higher than the first predetermined frequency. The first clock circuit and the second clock circuit may be independent circuits or may form a clock circuit 209. As a result of the difference in frequencies, a slip is produced in the sample times or intervals of a strobed voltage comparator 206. The first clock circuit 208 determines the frequency of the unit test period $F_{UTP}$ of the signal input to the device under test 202. The unit test period is defined as the period of time corresponding to one cycle of the repeating test signal. $F_{UTP}$ is equal to the frequency of the first clock circuit divided by an integer M, where M may be any positive integer including 1. The second clock source controls the frequency rate $F_{SAR}$ of the comparator 206 which samples the output of the device under test 202. The strobe rate of the comparator 206 $F_{SAR}$ may be determined by the relationship $F_{SAR}=F_{UTP}/(1+D/S)$ where S is the number of samples desired to be collected over the unit test period and D may be any integer which is mutually prime with S. The value of D may be chosen to give the highest acceptable $F_{SAR}$ frequency that does not violate the settling time constraints of the SAR DAC 216 or the maximum strobe rate of the sampler head comparator 206.

FIG. 5 illustrates a first clock circuit 208 coupled to a signal generator 200, providing clock pulses at a first predetermined frequency to the signal generator 200. The signal generator 200 is coupled to the device under test 202, and the signal generator 200 forms analog waveforms for example, a sine waveform with the frequency supplied from dock source 208 divided by M, or alternatively generates a digital pattern from memory locations (not shown) within the waveform signal generator 200, again, at the frequency of the clock source 208 divided by M. The device under test 202 is coupled to the sampler head 204 for example, to a strobed comparator 206. The device under test 202 may be any device that is to be tested. The device under test 202 outputs a test signal for example, a repeating test signal to comparator 206. The repeating test signal is assumed to have the same repetition frequency, $F_{UTP}$, as the signal generator 200. The comparator 206 is coupled to the processor and memory circuit 218, exemplary SAR logic and capture memory, and to the clock buffer 214. The comparator 206 outputs one-bit comparator result signals to processor logic and memory circuit 218. The comparator 206 compares the outputted test signal with the output of SAR DAC 216 to output the compare results signal. The compare results signal is a one-bit voltage comparison between the output of the SAR DAC circuit and the repeating test signal, strobed at regularly spaced intervals of time.

A second clock circuit 210 is coupled to a divide by N circuit 212, to output clock pulses from the divide by N circuit 212 at a second predetermined frequency. The frequency of the second predetermined frequency should correspond to the first predetermined frequency in accordance with a predetermined ratio by a processor. Both the first predetermined frequency and the second predetermined frequency advantageously have low jitter in order to provide adequate precision in strobe placement. Presuming S samples are desired to be collected over a predetermined unit test period, the second predetermined frequency should be substantially equal to the first predetermined frequency times $M/(N(1+D/S))$. This frequency ratio is equivalent to the relationship $F_{SAR}=F_{UTP}/(1+D/S)$. The divide by N circuit 212 is coupled to the clock buffer circuit 214 and the processor and memory circuit 218 to time the storage of the comparator results signal with sampling of the comparator 206. The divide by N circuit 212, slows the input clock pulses to eliminate entire cycles of the input clock pulses so that the strobe rate of the comparator 206 is sufficiently low to provide adequate settling time for the SAR DAC 216 analog output. The divide by N circuit 212 also limits the required frequency range of the second clock source 210, advantageously reducing strobe time jitter. Alternatively, the divide by N circuit may be integrated into the second clock source 210, in which case it is not required on the high speed sampler control card. The clock buffer circuit 214 buffers the input clock cycles and is connected to the comparison circuit 206 to time the comparison between the input test signal and the input signal from the SAR digital to analog converter circuit 216. The clock buffer circuit 214 outputs both a buffered strobe signal and an inverse of the buffered strobe signal to the comparator 206. The outputs from the clock buffer circuit 214 determines when to take the comparison between the inputs to the comparator circuit 206. This provides a strobed comparison between the inputs to the comparator circuit 206.

The SAR digital to analog converter circuit 216 is connected to the comparator 206 to provide the successive approximation voltage which is necessary for the SAR process. The processor and memory 218 controls the SAR digital to analog circuit 216 to achieve a strobed comparison of the DUT output voltage and the SAR digital to analog converter output voltage. The processor and memory 218, which may be very large scale integration (VLSI) digital logic, computer, mini computer, microcomputer or a personal computer, all having a waveform capture memory, controls the SAR digital to analog converter 216 to output voltage levels for comparison with the repeating test signal. The one-bit outputs of the comparator are stored in the memory of SAR logic and capture memory 218. These outputs are used by the SAR logic 218 to control the SAR digital to analog converter 216 to output successively refined SAR comparison levels for the comparator 206 based on previous SAR digital to analog converter 216 settings and subsequent outputs of the comparator 206.

In operation, the clock circuit 208 outputs first clock pulses to the waveform generator circuit 200, which in turn outputs a repetitive waveform or in the alternative a repetitive digital pattern to the device under test circuit 202, exemplary a high frequency waveform in accordance with the output first clock pulses. The device under test circuit 202 outputs a repeating test signal to the comparator 206. A second clock circuit 210 outputs second clock pulses at a second predetermined frequency to the divide by N circuit 212. The divide by N circuit 212 may reduce the frequency of the second clock pulses to allow more settling time for the SAR digital to analog converter 216 output. The clock pulses generated by the divide by N circuit 212 are output to clock buffer circuit 214, which in turn outputs the buffered dock pulses to the comparator 206 to time the strobed comparisons between the repeating test signal and the output signal from the SAR digital to analog converter 216. The processor and memory circuit 218 outputs control signals to the SAR digital to analog converter circuit 216 so that the comparator may compare the output bits of the SAR digital to analog converter circuit 216 with the repeating test signal from the device under test 202. The one-bit comparison signal is output to the processor and memory 218, which saves each output of the comparator 206 into a unique memory location for use in subsequent SAR DAC voltage refinements. Because sequential comparisons do not correspond to the same sample point in the DUT output voltage waveform, it is necessary to collect all most significant bit (MSB) comparisons before collecting all intermediate significant bit comparisons and finally all least significant bit (LSB) comparisons. This is different from making all comparisons, MSB to LSB, for a given sample point on the test waveform before making comparisons on subsequent sample points. The collection of bits of equal significance from each sample point with the SAR logic and capture memory 218 into a bank of capture memory in the order of successively lower significance allows the sample timing to constantly slip relative to the input waveform, eliminating the need for the undesirable delay generator of the prior art. Thus, the SAR process implemented by the SAR logic and capture memory 218 should reorder successive approximations due to the constantly shifting comparator strobe time.

Figure 7:
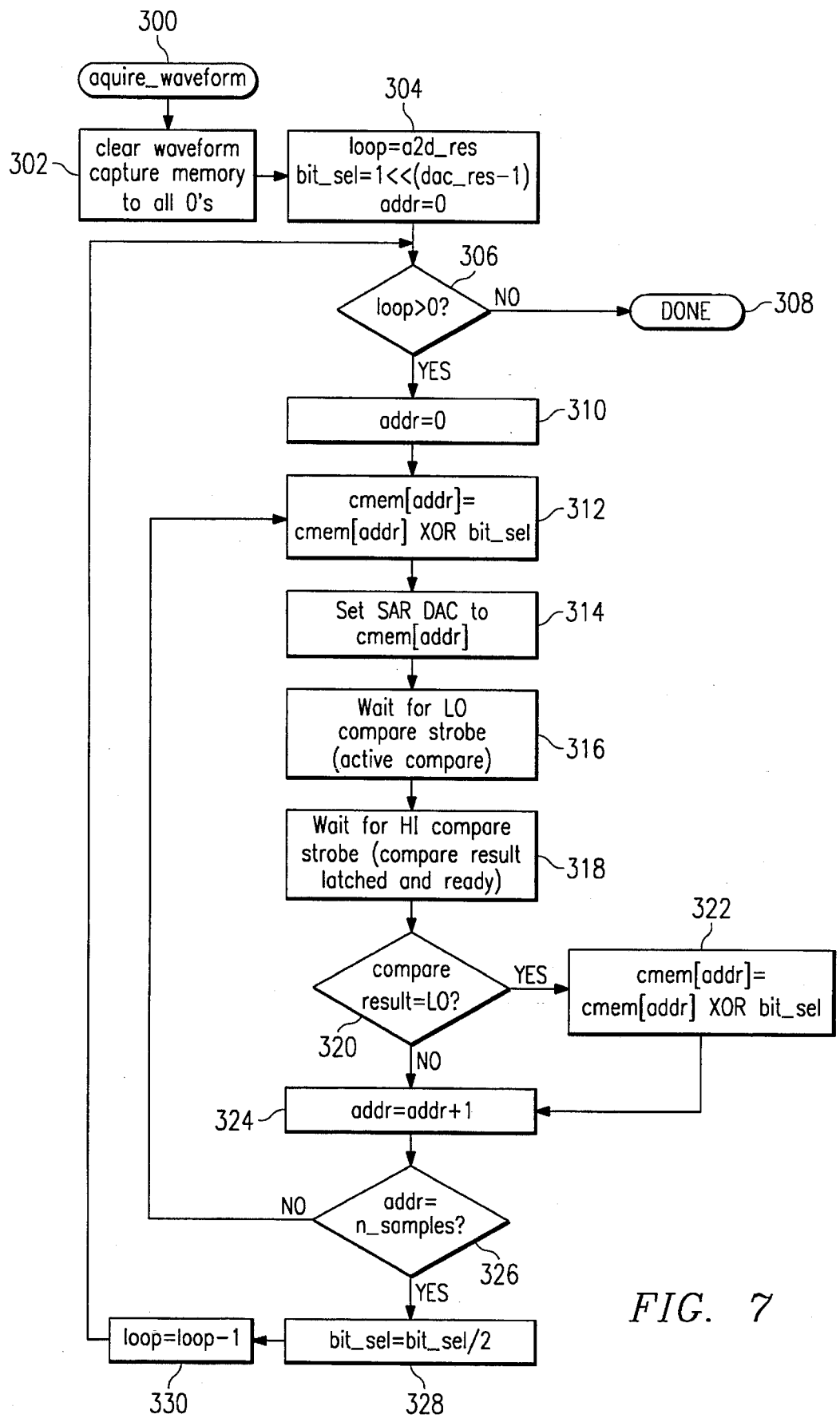
FIG. 7 illustrates a flow chart for the SAR logic and capture memory.

FIG. 7 illustrates a flow chart of the SAR process of the present invention. The processor and memory 218 may be VLSI digital logic, a microprocessor, a computer, a minicomputer or a micro-computer, etc. Additionally, the processor and memory circuit 218 may be distributed over a network. Referring now to FIG. 7, block 300 illustrates that a command to acquire the waveform is received by the processor and memory circuit 218. In block 302, the waveform capture memory of the SAR logic and capture memory circuit 218 is cleared for example, to all zeros. In block 304, the loop counter is set to the desired digitizer resolution. The SAR bit selection value is set to $2^{(SAR\ DAC\ resolution\ -1)}$ or, equivalently, to binary 1 shifted left by (SAR DAC resolution −1) binary positions. Exemplary, if the SAR DAC has a resolution of 8 bits, the bit selection value would be initially set to binary 10000000 to select the most significant bit of the SAR DAC 216. Additionally, the capture memory address pointer is set to zero. In decision block 306, it is determined if the loop variable is greater than zero. If it is not, then the waveform capture memory array contains the complete digitized waveform, as illustrated in block 308. If the loop counter is greater than zero, than the capture address memory pointer is set to zero in block 310, and in block 312 the waveform capture memory array element at the location of the capture memory pointer is exclusively ored (XOR) to the SAR bit selection value. In block 314, the SAR digital to analog converter 216 is set to the value specified by the capture memory array element at the location of the capture memory pointer. For example, the value 0000 . . . 000 corresponds to minus full scale of the SAR digital to analog converter 216, 1111 . . . 111 corresponds to plus full scale, and 1000 . . . 000 corresponds to midscale. In block 316, the processor and memory circuit 218 waits for a "low" compare strobe to indicate an active compare. In block 318, the processor and memory 218 waits for a "high" compare strobe indicating that the compare result is latched and ready. In decision block 320, the compare result logic state is examined. If the result is LO (logic 0), in block 322, the waveform capture memory array element at the address selected by the capture memory address pointer is exclusively ored (XOR) with the SAR bit selection value. If the result from decision block 320 is HI (logic 1), and after decision block 322 has been executed, in block 324 the capture memory address pointer is incremented by one. In decision block 326, the captured memory address pointer is compared with the number of samples. If the number of samples has not been reached, block 312 is executed. If the capture memory address pointer equals the number of samples, the SAR bit selection value is divided in half in block 328. In block 330, the loop counter is decremented by one. Control is transferred to decision block 306.

The example in FIG. 6 corresponds to a selection of N=1, M=1, and D=1. FIG. 6 illustrates the lack of slip between the most significant bit for a given sample and the least significant bit of a given sample. FIG. 6 illustrates that even though the most significant bits for samples 1, 2 and 3 are first collected with a fixed time slip between each comparison, there is no slip between the most significant bits of each sample and the least significant bits for each sample despite the fact that a significant period of time or cycles of the repeating test signal may have occurred between the time when the most significant bit for each sample is obtained and the time when the least significant bit for that sample is obtained. However, the slip between adjacent samples is very evenly spaced, which results in a linear, coherent sampling rate. Sampling time slip between adjacent samples without time slip between MSB's and LSB's of a given sample is the result of the previously described selection of the second clock frequency based on the desired values of M, N, D, S, and the first clock frequency. Thus, a coherent undersampling SAR process is obtained which may be subject to FFT processing. The processor and memory circuit 218 is coupled to either an ATE tester computer or a DSP processor or both 220, and to the SAR digital to analog converter circuit 216. After all bits of each sample have been collected, the processor and memory 218 may output the contents of the waveform capture memory to the ATE tester computer and DSP processor 220 for further testing and processing. Alternatively, the SAR logic may perform further processing on the collected waveform before transferring the processed waveform the ATE computer and/or DSP processor 220. The SAR logic may instead reconstruct the captured waveform at a lower sampling rate using the SAR DAC converter 216 or another DAC, not shown. This reconstructed signal, representing a lower frequency image of the original high frequency test signal, could be directly viewed using an oscilloscope or other display device, or it could be resampled by a prior art low frequency digitizer.

Other embodiments of this invention are possible. The SAR digital to analog converter 216 can be replaced by a 2's complement digital to analog converter, for which 0111 . . . 111 corresponds to plus full scale, 1000 . . . 000 corresponds to minus full scale, and 0000 . . . 000 corresponds to mid-scale. In this case, a minor modification of the SAR logic/flowchart would be needed to account for the different encoding scheme of the 2's complement DAC.

A second alternative embodiment could be used to minimize the sample collection time of the digitizer. The values D=1+IS where I is zero or any positive integer results in samples that are ordered in the same sequence as the test waveform at the output of the DUT 202. However, other values of D will produce S evenly spaced time intervals that are not in sequential order, so long as D and S are mutually prime. These timing points are equally useful in digitizing the signal, but the output waveform will appear sequentially scrambled in the capture memory 218. The captured waveform can be reordered either by the address pointer in the SAR logic 218 while samples are captured, or the waveform can be reordered by the SAR logic 218 before transferring the waveform to the ATE tester computer 220. Alternatively, the samples may be reordered using the ATE tester computer or DSP processor 220 after the waveform is transferred. The advantage of this reordered approach is that it allows more flexibility in the selection of the values of N and D. As a result, the frequency of the SAR process can be optimized to reduce sample collection time while providing sufficient settling time for the SAR DAC output 216. Test signal collection time is therefore advantageously minimized by careful selection of N and D.

The strobed comparator 206 can have either a differential strobe input, as shown, or a single-ended strobe input. Differential strobe inputs are common in high speed strobed comparators because they reduce strobe time jitter introduced by ground bounce and other forms of interference on the strobe signal. However, a single-ended strobe input could be used as long as timing of the strobe could be well controlled.

What is claimed is:

1. An apparatus for measuring a repetitive test waveform in a coherent manner, comprising:

a signal generating circuit to generate and output said repetitive test waveform in accordance with first clock signals;

a first clock circuit coupled to said signal generating circuit to output said first clock signals at a first clock frequency;

a strobed comparator to sample the repetitive test signal in accordance with second clock signals and to output a one-bit comparison result signal;

a second clock circuit coupled to strobed comparator circuit to output said second clock signals at a second clock frequency;

a processor coupled to said first clock circuit and said second clock circuit to determine a frequency ratio between said first clock frequency and said second clock frequency, said processor using frequency ratio for producing S sampling point signals evenly spaced across said repetitive test waveform;

a successive approximation digital to analog converter for providing a comparison level to said strobed comparator and to receive said S sampling point signals;

said processor to generate and provide successive approximation values to said successive approximation routine digital to analog converter;

waveform capture memory to store said one bit comparison result signal for subsequent retrieval and refinement by successive approximation routine logic, said waveform capture memory and said successive approximation routine logic collecting one bit at a time from each digitized sample from said S sampling point signals, all most significant bits MSB's first, all least significant bits LSB's last, resulting in a digitized waveform corresponding to said repetitive test waveform.

2. An apparatus for measuring a repetitive signal as in claim 1, wherein said repetitive test waveform is a digital signal.

3. An apparatus for measuring a repetitive signal as in claim 1 or 2, wherein an output circuit outputs said digitized waveform to a host computer, digital signal processor, or waveform display device.

4. An apparatus for measuring a repetitive signal as in claim 1, or 2, wherein said frequency ratio is determined by the relationship:

$$F_{SAR} = F_{UP} \times (N \times S)/((N \times S)+1).$$

5. An apparatus for measuring a repetitive signal as in claim 1, or 2, wherein said frequency ratio is selected to minimize collection time, resulting in a scrambled sample order, such apparatus including a descrambling circuit or software routine to reorder the samples before outputting or displaying said digitized waveform.

6. An apparatus for measuring a repetitive signal as in claim 1, in which said strobed comparator includes a differential strobe input.

7. An apparatus for measuring a repetitive signal as in claim 1, or 2 in which said strobed comparator includes a single-ended strobe input.

\* \* \* \* \*